(12) United States Patent
Feil

(10) Patent No.: US 12,433,013 B2
(45) Date of Patent: Sep. 30, 2025

(54) SEMICONDUCTOR DIE WITH A VERTICAL TRANSISTOR DEVICE

(71) Applicant: Infineon Technologies Austria AG, Villach (AT)

(72) Inventor: Thomas Feil, Villach (AT)

(73) Assignee: Infineon Technologies Austria AG, Villach (AT)

( * ) Notice: Subject to any disclaimer, the term of this patent is extended or adjusted under 35 U.S.C. 154(b) by 749 days.

(21) Appl. No.: 17/743,535

(22) Filed: May 13, 2022

(65) Prior Publication Data

US 2022/0375929 A1  Nov. 24, 2022

(30) Foreign Application Priority Data

May 21, 2021 (EP) .................................... 21175157

(51) Int. Cl.
| | | |
|---|---|---|
| *H10D 84/80* | (2025.01) | |
| *H10D 1/47* | (2025.01) | |
| *H10D 1/68* | (2025.01) | |
| *H10D 30/01* | (2025.01) | |
| *H10D 30/66* | (2025.01) | |
| *H10D 64/00* | (2025.01) | |

(52) U.S. Cl.
CPC ............ *H10D 84/811* (2025.01); *H10D 1/47* (2025.01); *H10D 1/692* (2025.01); *H10D 30/0291* (2025.01); *H10D 30/66* (2025.01); *H10D 64/117* (2025.01)

(58) Field of Classification Search
CPC . H01L 29/407; H01L 21/765; H01L 29/1095; H01L 29/66712; H01L 29/7806; H01L 29/0878; H01L 29/41766; H01L 29/7802; H10D 84/811; H10D 1/47; H10D 1/692; H10D 30/0291; H10D 30/66; H10D 64/117; H10D 1/665; H10D 62/371; H10D 62/378; H10D 62/157; H10D 64/256; H10D 84/141; H10D 64/112; H03K 17/165

See application file for complete search history.

(56) References Cited

U.S. PATENT DOCUMENTS

| | | | |
|---|---|---|---|
| 6,545,316 B1 | 4/2003 | Baliga | |
| 10,211,822 B2 * | 2/2019 | Stefanov | ................... H03K 5/08 |
| 11,428,750 B1 * | 8/2022 | Ginart | ..................... G01R 31/42 |
| 2006/0126253 A1 | 6/2006 | Urakabe et al. | |
| 2011/0148376 A1 * | 6/2011 | Xu | ......................... H03K 17/165 |
| | | | 327/434 |

(Continued)

FOREIGN PATENT DOCUMENTS

EP    0703664 A2    3/1996

*Primary Examiner* — Steven B Gauthier
*Assistant Examiner* — Khatib A Rahman
(74) *Attorney, Agent, or Firm* — Murphy, Bilak & Homiller, PLLC

(57) ABSTRACT

The disclosure relates to a semiconductor die, including a vertical power transistor device, a pull-down transistor device, and a capacitor. The pull-down transistor device is connected between a gate electrode of the vertical power transistor device and a ground terminal and connects the gate electrode to the ground terminal in a conducting state. The capacitor is connected between one of the load terminals of the vertical power transistor device and the control terminal of the pull-down transistor device and capacitively couples the one load terminal to the control terminal.

21 Claims, 9 Drawing Sheets

(56) References Cited

U.S. PATENT DOCUMENTS

| | | | |
|---|---|---|---|
| 2014/0084295 A1 | 3/2014 | Hirler et al. | |
| 2014/0264577 A1* | 9/2014 | Rieger | H10D 84/141 |
| | | | 257/337 |
| 2014/0368254 A1* | 12/2014 | Lee | H03K 17/165 |
| | | | 327/378 |
| 2016/0240640 A1* | 8/2016 | Nakamura | H10D 62/133 |
| 2019/0081562 A1* | 3/2019 | Palm | H01F 17/062 |
| 2020/0395930 A1* | 12/2020 | Araki | H03K 17/165 |

* cited by examiner

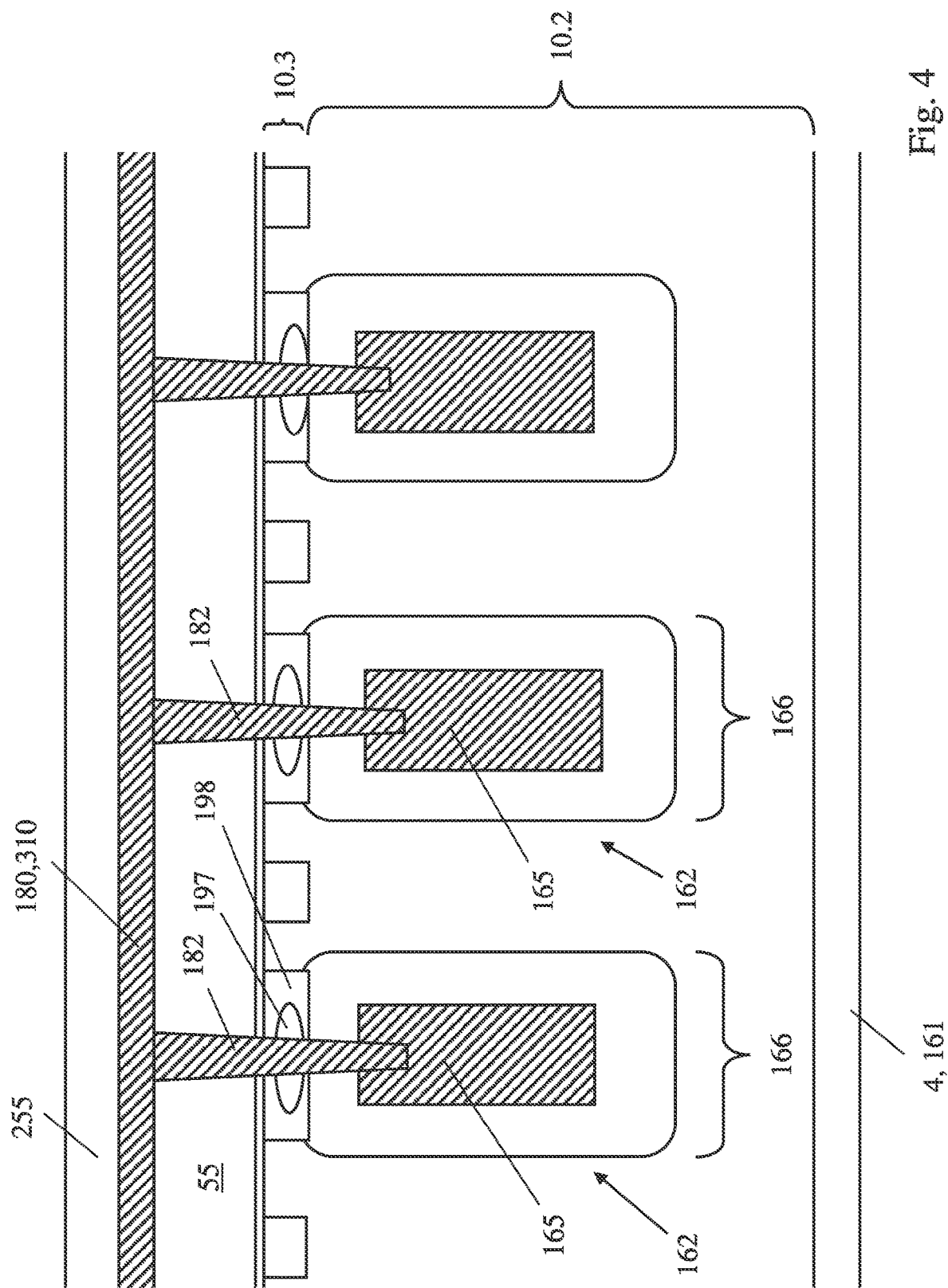

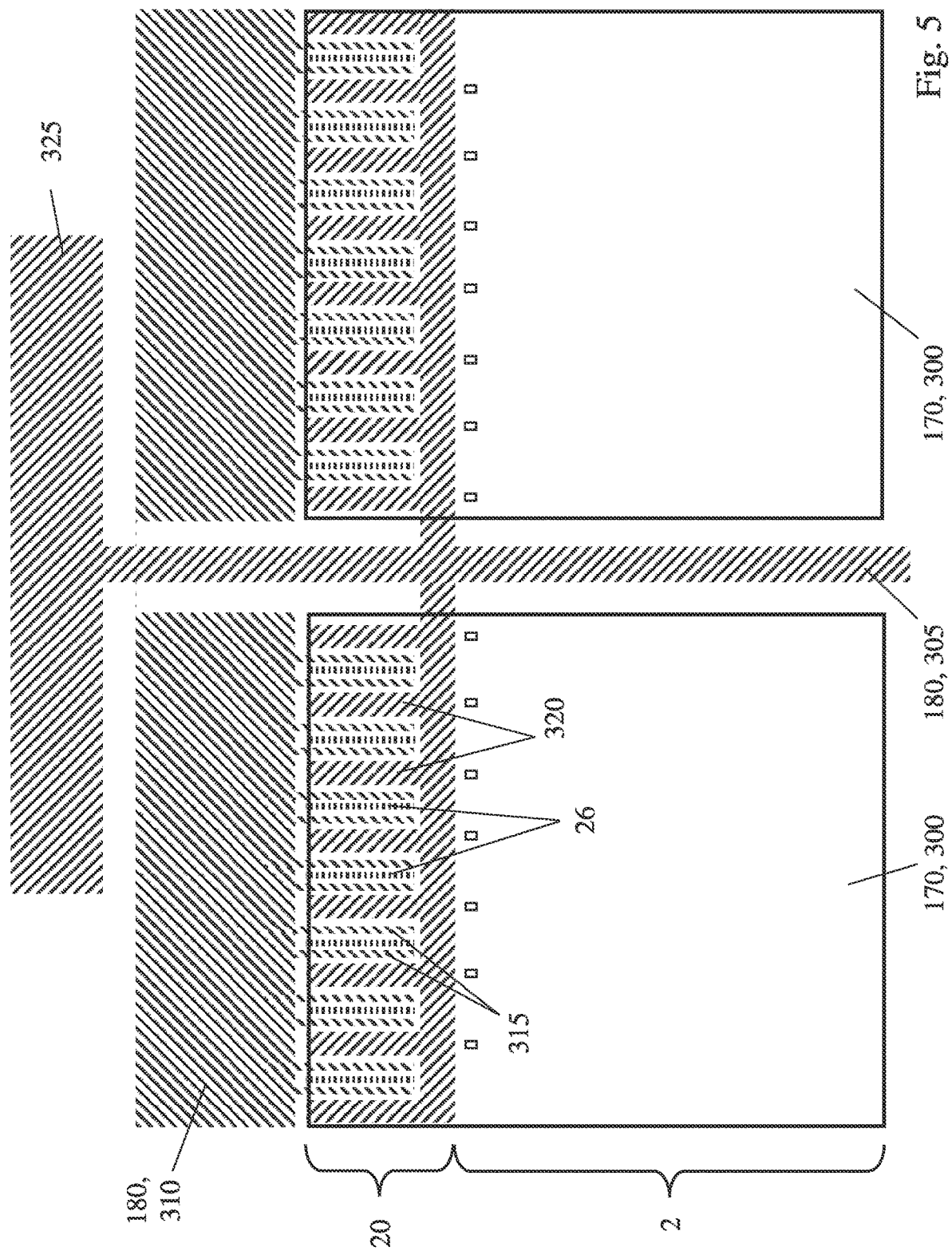

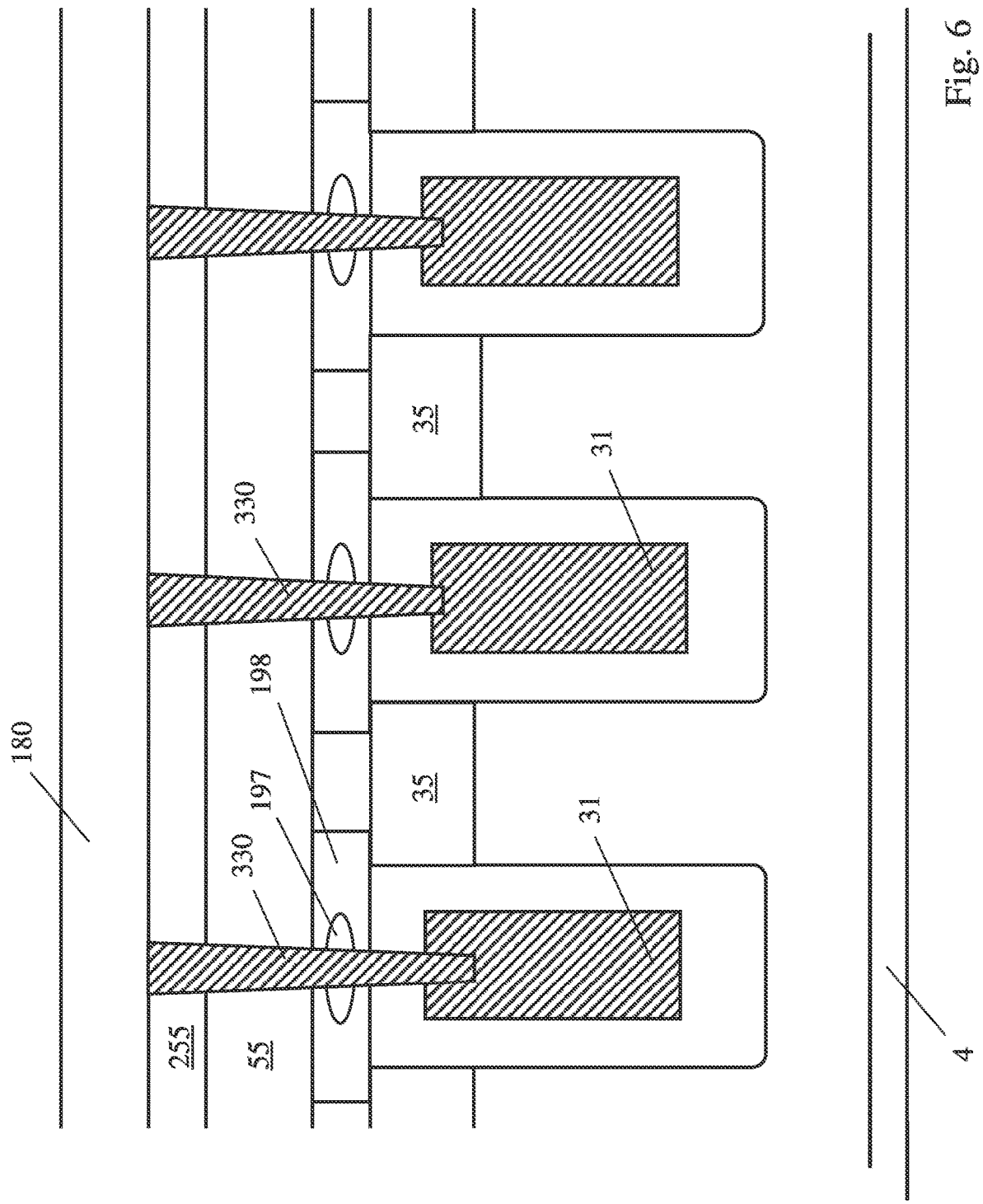

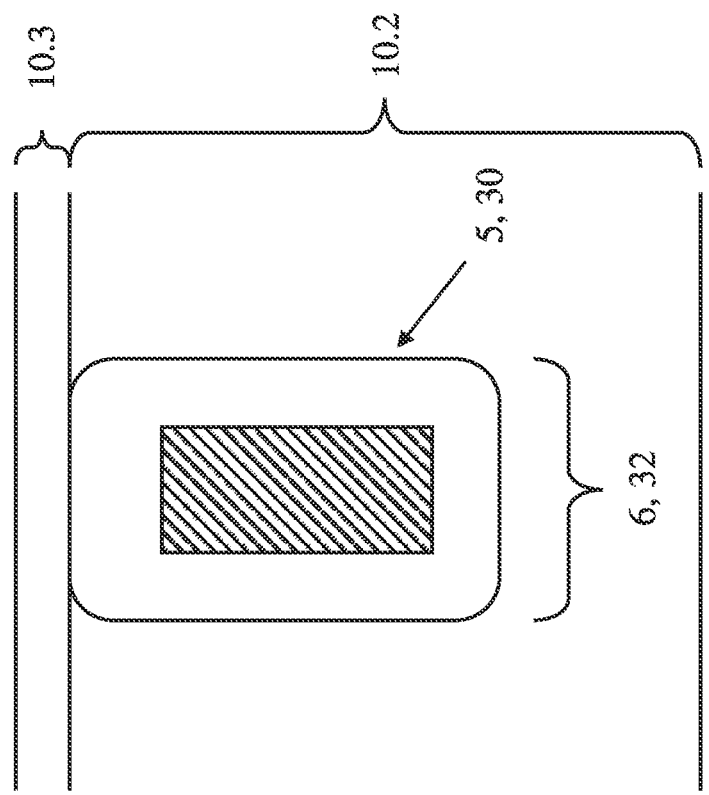
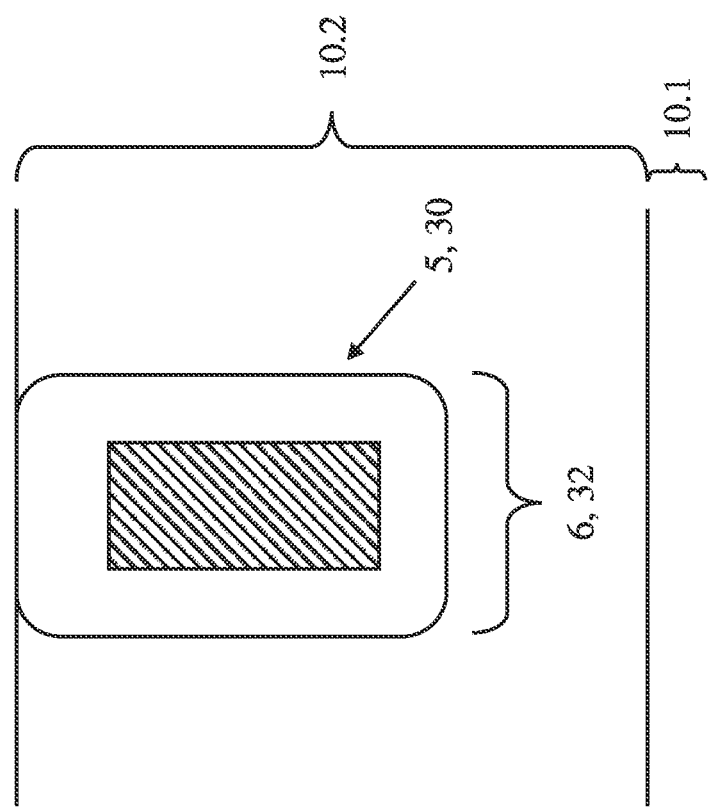

SEMICONDUCTOR DIE WITH A VERTICAL TRANSISTOR DEVICE

TECHNICAL FIELD

The present disclosure relates to a semiconductor die with a vertical power transistor device.

BACKGROUND

The vertical power device has a source and a drain region at opposite sides of a semiconductor body. Via a gate electrode, a channel path formation in its body region and, in consequence, the current flow can be controlled. Depending on the specific application, the die with the vertical power device can be co-packaged with other dies, e. g. with another power device and/or a driver chip. A DC-DC converter can for example comprise two discrete power transistors and the driver chip in a common package.

SUMMARY

It is an object of the present application to provide an improved semiconductor die with a vertical power device as well as a method of manufacturing the same.

In addition to the vertical power device, the die comprises a pull-down transistor device, which is switchable between a conducting and a blocking state via a control terminal. It is connected between the gate electrode of the vertical device and a ground terminal and grounds the gate electrode of the vertical device in the conducting state. To trigger or switch the pull-down transistor into the conducting state, a capacitor is provided between its control terminal and a load terminal of the vertical device, namely either its source region or in particular its drain region.

During a switching event of the vertical device, the potential at the respective load terminal rises and charges the capacitor. In consequence, e. g. in an overshoot event, the control terminal of the pull-down device is also charged. It switches into the conducting state, pulling the gate potential of the vertical device to ground. This can for instance limit a capacitive charging of the gate electrode of the vertical device, which could for example result from a rising drain potential during the overshoot event. By grounding the gate electrode, e. g. gate oscillations of the power device can be minimized.

The monolithic integration of the vertical and the pull-down device, together with the capacitor coupling these two devices, in the same die can enable a higher order integration, reducing for instance the complexity on package level. E. g. in comparison to an external driver for the pull-down device, the integrated capacitor can be a self-controlling setup, triggered by an overshoot on the load terminal, e. g. drain region. In other words, the pull-down transistor is directly driven by the overshoot event, e. g. without an external control circuit, which can reduce the number of external connections or interfaces.

In general words, an approach of this application is to combine a vertical power transistor device with a pull-down device and a trigger circuit connecting the control terminal of the pull-down device to the vertical device monolithically in the same die. Particular embodiments and features are presented throughout this disclosure and in the dependent claims. Thereby, the individual features shall be disclosed independently of a specific claim category, the disclosure relates to apparatus and device aspects, but also to method and use aspects. If for instance a device or die manufactured in a specific way is described, this is also a disclosure of a respective manufacturing process, and vice versa.

Source and drain of the vertical device are arranged at opposite sides of the die, in particular the source region at the frontside and the drain region at the backside. Its channel region can extend vertically, namely be arranged laterally aside a gate region formed for example in a vertical gate trench. In particular, however, the channel can extend laterally and, in consequence, be aligned vertically with the gate region, see in detail below. Providing the vertical device with a lateral gate can for instance simplify the integration of the lateral device into the same die, e. g. allow for a certain process integration ("re-use" of one or more power device process steps for the pull-down device).

The more generic term "load terminal" is used to comprise both, the source and the drain region of the vertical power device. In particular, however, the capacitor is connected between the control terminal of the pull-down device and the drain region of the vertical device. In general, the power device can be used in a so-called high side configuration, namely be connected between the supply voltage and the load, the pull-down device allowing for instance for a slightly increased switching speed or loss reduction (on the other hand, an avalanche of the vertical device could occur at lower currents, which could affect the long-term stability). In particular, the power device is used in a low side configuration, connected between load and ground, wherein the pull-down device can for instance minimize the gate oscillations, see above.

In an embodiment, a first resistor is formed in the die and connected between the capacitor and the control terminal of the pull-down device, E. g. in an overshoot event, the control terminal of the pull-down device is charged via the first resistor, for instance when the drain potential rises and charges the capacitor. The first resistor can for example be formed in a metallization layer arranged on a smaller vertical height than a frontside metallization of the vertical device, in the same metallization layer e. g. a gate redistribution or a gate liner or finger of the vertical device can be formed. The resistance can also be adjusted via polysilicon in a trench, for instance of the second capacitor trench electrode, see below.

In an embodiment, a second resistor is formed in the die and connected between the control terminal of the pull-down device and the ground terminal. During normal operation, the control terminal is grounded via the second resistor. E. g. during an overshoot, it gets charged and the pull-down device is switched into the conducting state, before the control terminal reverts back to ground when the charge floats off via the second resistor. Like the first resistor, the second resistor can be formed in the metallization layer and/or in particular via vertical interconnects, e. g. interconnects to the frontside metallization. The resistance can also be adjusted via polysilicon, e. g. gate polysilicon, arranged in a trench or hole.

In general, the power device can be a p-channel device having an n-doped body region. In a particular embodiment, it is an n-channel device, the body region being p-doped and the source and the drain region being n-doped. The source region can in particular be connected to the ground terminal of the die, the capacitor being connected between the control terminal of the pull-down device and the drain region of the power device. In other words, the pull-down device electrically connects the gate electrode to the source region of the vertical device, when in the conducting state. Due to the low-side configuration, where source is on ground, the pull-down device grounds the gate electrode.

In an embodiment relating to the capacitor connected to the drain region of the power device, this drain region is arranged at a backside of the die or semiconductor body and forms a first capacitor electrode of the capacitor. In other words, the drain region itself is part of the capacitor, an overshoot being picked up directly. The drain region can in particular extend over the whole backside of the die ("common drain backside"), see in detail below.

In an embodiment relating to the capacitor connected to the drain region, the source regions of the vertical device and of the pull-down device are connected with each other via the frontside metallization of the vertical device. The frontside metallization can be made of copper or in particular aluminum, e. g. AlCu. It can basically cover the area of the die, in which the power device is formed. In addition, it can extend above an area where the pull-down device is formed, covering the latter for instance completely. The gate metallization layer mentioned above can be arranged on a smaller vertical height, e. g. extend at least partially below the frontside metallization, and it can have a smaller vertical thickness.

In an embodiment, the drain region of the pull-down device is connected to the gate electrode of the vertical device via a gate metallization layer. For the vertical power device, a gate pad of die, e. g. a bond pad, and/or a gate runner can be formed in the gate metallization layer. The gate runner can, seen in a vertical top view, extend for instance laterally aside the vertical device, e. g. I-, L- or U-shaped aside or around the cell field. Using the gate metallization layer for the connection between the gate electrode of the vertical device and the pull-down device can allow for a "re-use" of existing layers, enabling for example a process integration.

In an embodiment, the pull-down device is a lateral device, having a source and a drain region formed at the frontside of the semiconductor body. Below the pull-down device, a well region and/or a shielding field electrode region can be formed in the semiconductor body. In particular, seen in a vertical cross-section, at least two shielding field electrode regions can be formed in a respective trench, the well region extending laterally between the trenches. At least a portion of the lateral pull-down device can be arranged above the well region and/or the shielding field electrode region. The well and/or shielding field electrode regions can be arranged vertically between the lateral pull-down device and a common drain backside of the semiconductor die or body.

The well region can be doped with an opposite conductivity type as the source and the drain region of the vertical device, e. g. be p-doped in case of an n-channel power device. It can in particular be electrically connected to the source region of the vertical device and reduce or compensate the backside potential, in particular common drain potential. The same applies for the shielding field electrode region, which can be provided as an alternative or in particular in combination with the well region. The shielding field electrode or electrodes can be made of polysilicon or metal or both. A common drain backside can be advantageous in view of the manufacturing or packaging effort, also in view of a process integration, wherein the well or shielding field electrode region can allow for a safe and stable operation of the lateral pull-down device (e. g. without deep trenches for an electrical isolation between the devices).

In an embodiment, a second capacitor electrode connected to the control terminal of the pull-down device comprises a trench electrode formed in a capacitor trench extending into the semiconductor body. The electrode can for instance be made of polysilicon or metal or both. The capacitor trench can in particular extend into a lower semiconductor body, in particular into a lower epitaxial layer, in which for instance the drift region of the vertical device can be formed (in another area of the die). In addition to the capacitor electrode, e. g. a capacitor dielectric can be formed in the capacitor trench, and the capacity can for instance be tuned via the capacitor electrode depth and/or width, and also via the dielectric properties. The capacitor trench electrode or electrodes can form the capacitor together with a backside of the die, in particular together with the drain region (see above). In case of a common drain backside, the capacitor trench can be arranged outside an area of the vertical device, e. g. laterally aside the pull-down device and/or the vertical device. In general, e. g. as an alternative to the capacitor trench electrodes, a metal plate on the frontside could pick up the backside potential which can reach up to the frontside.

In an embodiment, the vertical power device comprises a field electrode region formed in a field electrode trench extending into the drift region. The field electrode region comprises a field electrode, e. g. made of polysilicon or metal or both, and a field dielectric separating the field electrode from the drift region. Seen in a vertical top view, the field electrode trench can for instance have a longitudinal extension, a plurality trenches being for instance arranged as parallel stripes. Alternatively, the field electrode trench can be a needle trench, wherein needle-shaped and longitudinal trenches can also be combined across the die. Depending on the application, the field electrode can for instance be connected to the source region, e. g. to the frontside metallization.

The field electrode trench of the vertical device and the capacitor trench, and/or the field electrode trench of the vertical device and the shielding field electrode trench, can in particular be etched simultaneously, allowing for an integration of process steps. Alternatively or in addition, the respective field dielectrics and/or electrodes can be formed simultaneously. The field electrode trench and the capacitor electrode trench can in particular have the same vertical depth, alternatively or in addition the shielding field electrode trench can be deeper than the field electrode trench.

In an embodiment, the capacitor electrode is contacted via a vertical interconnect intersecting an insulating layer formed on the frontside of semiconductor body. The vertical interconnect can be made of metal, e. g. tungsten. In particular, a plurality of trench electrodes can be provided, each formed in a respective capacitor trench and contacted by a respective vertical interconnect. A metallization layer formed on the insulating layer can connect the vertical interconnects and, in consequence, the capacitor trench electrodes with each other, in particular a gate metallization layer (see above). The vertical interconnects can form the first resistor, see above. Seen in a vertical top view, a metallization plate can be formed above the capacity trenches, one or a plurality of gate fingers being for instance formed on one lateral side of the plate and extending above the pull-down device cell field, contacting the control electrode or electrodes of the pull-down device.

In an embodiment, the semiconductor body comprises a lower semiconductor body and an upper epitaxial layer deposited onto the lower semiconductor body. Therein, the trenches, e. g. field electrode and/or capacitor and/or shielding field electrode trenches, are etched into the lower semiconductor body. In particular, the trenches solely extend in the lower semiconductor body, the upper epitaxial layer being for instance deposited after the trench etch and fill.

The lower semiconductor body can for instance comprise a semiconductor substrate, e. g. silicon substrate, and a lower epitaxial layer deposited onto the substrate, wherein the trenches can particularly be formed solely in the lower epitaxial layer.

In the upper epitaxial layer, e. g. above the shielding field electrode trench and the well region, the lateral device can be formed. In particular, the source, body and drain region of the lateral device can be formed by respective implantations in the upper epitaxial layer. The lateral gate region can be formed subsequently on the upper epitaxial layer, e. g. by depositing and structuring a field dielectric layer and depositing and structuring a field electrode layer.

In an embodiment, the vertical power device comprises a lateral channel and gate region, wherein the former can in particular be formed in the upper epitaxial layer. Due to the lateral design, the gate and the channel region are vertically aligned, in particular the gate region above the channel region. Particularly, at least a portion of the lateral channel and gate region can be arranged above a field electrode region of the vertical device, seen in a vertical cross-section e. g. a portion of at least 30%, 50%, 70% or 90%, in particular the whole channel region can be vertically aligned with the field electrode region. As illustrated in the exemplary embodiments in detail, the vertical device can in particular comprise a first gate region formed above a first side of the field electrode region or trench, and it can comprise a second gate region formed above a second side thereof, the first side lying at a first sidewall and the second side lying at a laterally opposite second sidewall of the field electrode trench of the vertical device, seen in a vertical cross-section.

Generally, the lateral channel and gate region of the vertical device, and in particular the at least proportional arrangement above the field electrode trench, can allow for an efficient area use. With a vertical channel, which can be an alternative in general, the possibilities for a further lateral shrink can be limited, e. g. because the field electrode trench itself requires a certain lateral width. This limitation can be circumvented at least to some extent by arranging the channel region of the vertical power device above the field electrode trench. Providing not only the lateral but also the vertical transistor device with a lateral gate region can also allow for a certain process integration, e. g. a simultaneous formation of the gate dielectrics and/or the gate electrodes of the vertical and the lateral device.

As mentioned, the application relates also to a method of manufacturing a semiconductor die disclosed here. It can comprise the steps:
  i) forming the vertical power device;
  ii) forming the pull-down transistor device;
  iii) forming the capacitor C.

Regarding further possible process details, reference is made to the description above and to the exemplary embodiments. For instance, the first and/or second resistor can be thrilled in addition. Step iii) can in particular comprise a plurality of sub steps, e. g. the drain formation at the backside (first capacitor electrode) and the capacitor trench and trench electrode formation (second capacitor electrode). Thereby, the field electrode and/or shielding field electrode trenches can be etched and/or filled simultaneously. Steps i) and ii) can also comprise simultaneous sub steps, e. g. a gate dielectric and/or gate electrode formation in case of the vertical power device with the lateral channel.

BRIEF DESCRIPTION OF THE DRAWINGS

Below, the semiconductor die with the vertical and the pull-down devices and the manufacturing are explained in further detail by means of exemplary embodiments. Therein, the individual features can also be relevant in a different combination.

FIG. 4 shows a capacitor coupling the vertical device to the pull-down device;

FIG. 5 illustrates the wiring between the capacitor of FIG. 4 and the pull-down device of FIG. 3, as well as between the vertical and the pull-down devices, in a top view;

FIG. 6 illustrates a contacting of shielding field electrodes arranged below the pull-down device;

FIGS. 7*a-d* illustrate some manufacturing steps;

DETAILED DESCRIPTION

Figure 1:
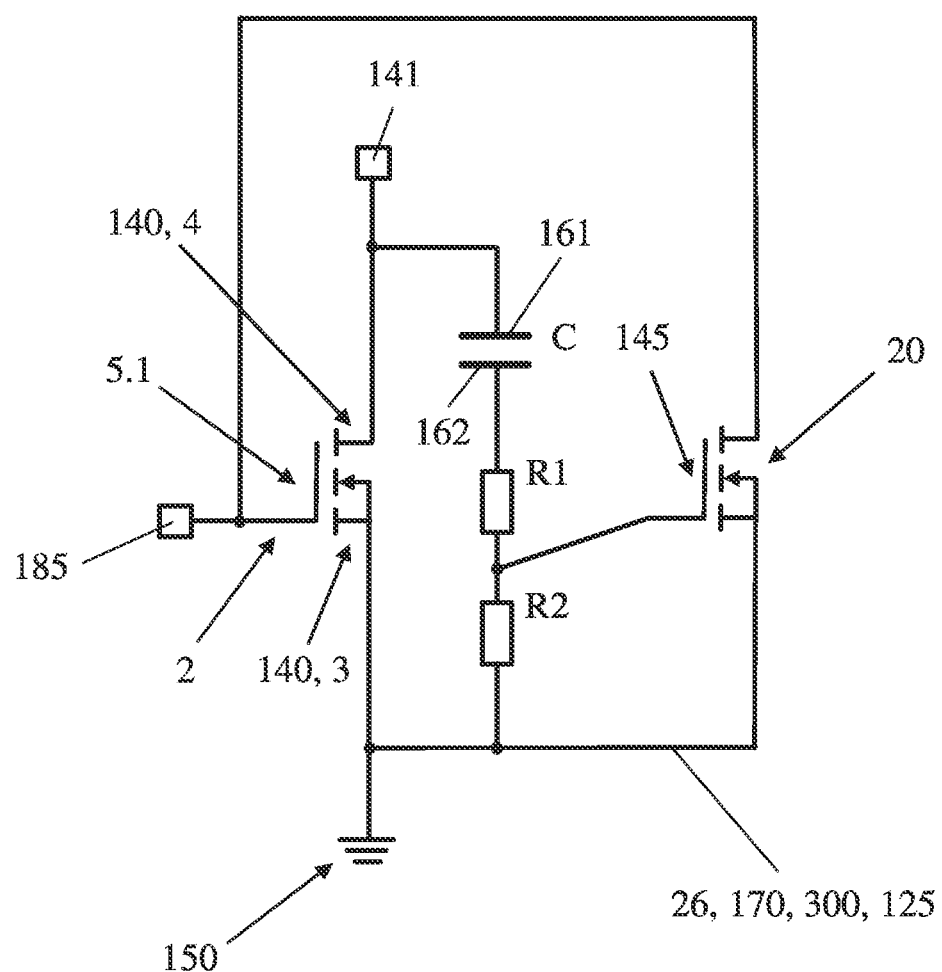
FIG. 1 shows a circuit diagram illustrating the coupling of a vertical power device and a pull-down device.

The circuit diagram of FIG. 1 illustrates a vertical power device 2 having two load terminals 140, one being its source region 3 and the other one its drain region 4. In the low side configuration shown, the drain region 4 is connected to a load 141 and the source region 3 is connected to a ground terminal 150. A gate electrode 5.1 of the power device 2 is controllable via a gate terminal 185.

Integrated in the same die with the power device 2, a pull-down transistor device 20 and a capacitor C are formed. The latter comprises a first capacitor electrode 161 connected to a load terminal 140 of the vertical power device 2, namely to the drain region 4 in this example. A second capacitor electrode 162 is connected to a control terminal 145 of the pull-down device 20. In case of an overshoot event, namely an increasing potential at the drain region 4, the capacitor C is charged. In consequence, the control terminal 145 of the pull-down device is charged as well, switching the pull-down device 20 into the conducting state. It consequently connects the gate electrode 5.1 of the vertical power device 2 to the ground terminal 150, which can for instance limit gate oscillations (the connection is indicated by the reference numerals 26, 170/300, 125, see FIGS. 3 and 5 for comparison).

The control terminal 145 of the pull-down device 20 is discharged via a second resistor $R_2$, it is grounded in steady-state operation. Consequently, the pull-down device 20 is switched to the blocking state again, and the gate electrode 5.1 of the vertical power device 2 is no longer grounded.

Figure 2:
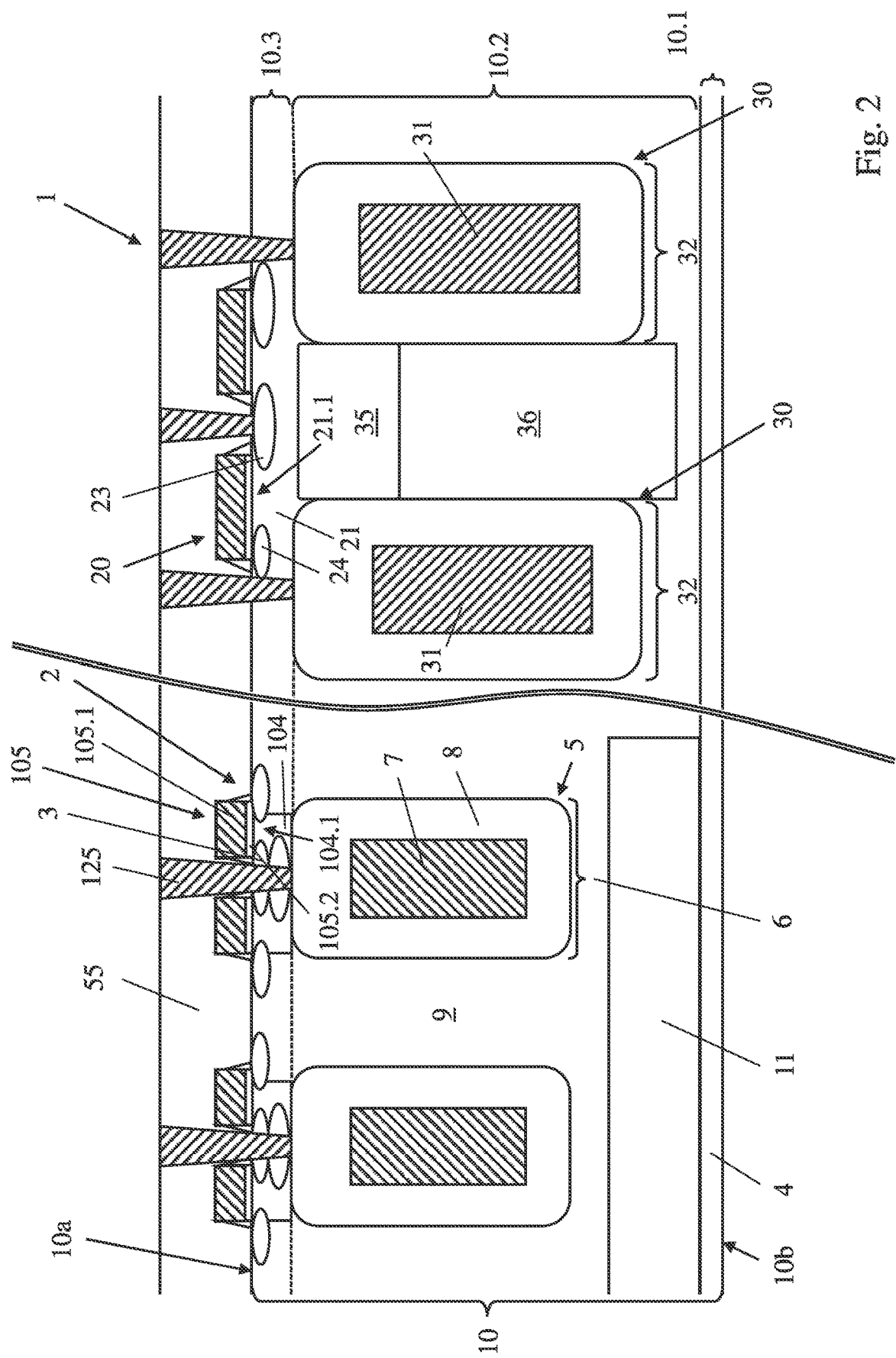
FIG. 2 shows a vertical cross-section and illustrates the integration of the vertical power device and the pull-down device into the same die.

FIG. 2 shows a sectional view of a semiconductor die 1, into which the vertical power transistor device 2 and the pull-down transistor device 20 are integrated. The vertical power device 2 has a source region 3 formed at a frontside 10*a* and a drain region 4 formed at a backside 10*b* of a semiconductor body 10. Though being a vertical device with the source and the drain region 3, 4 at opposite sides 10*a, b*, a channel region 104.1 formed in a body region 104 of the vertical power device 2 extends laterally. For an efficient area use, it is arranged vertically above a field electrode region 5 formed in a field electrode trench 6. The latter extends into a drift region 9 and comprises a field electrode 7 and a field dielectric 8.

On the frontside 10*a* of the semiconductor body 10, an insulating layer 55 is arranged, e. g. a silicon oxide layer. It is intersected by a contact 125 of the vertical device 2, which is arranged vertically above the field electrode 7. The contact 125 electrically connects the source region 3 to a frontside metallization (not shown). On the frontside 10a, covered by the insulating layer 55, a gate region 105 is arranged, it comprises a gate electrode 105.1 and a gate dielectric 105.2.

In addition to the vertical device 2, the pull-down device 20 is formed in the die 1, namely as a lateral device. It has a body region 21 with a lateral channel region 21.1, as well as a source and a drain region 23, 24, see FIG. 3 in detail. Due to the lateral design, the source and the drain region 23, 24 are both arranged at the frontside 10a of the semiconductor body 10. They are formed in an upper epitaxial layer 10.3, in which also the source region 3 and body region 104 of the vertical device 2 are arranged.

Below the pull-down device 20, in a lower semiconductor body 10.1, 10.2, in particular in a lower epitaxial layer 10.2, a shielding field electrode region 30 with a shielding field electrode 31 is formed in a shielding field electrode trench 32. The shielding field electrode or electrodes 31 shield the pull-down device 20 with respect to the backside 10b, namely with respect to the backside drain potential, which can enable a common drain backside. The shielding field electrodes 31 can be contacted outside the sectional plane shown, e. g. outside the cell of the pull-down device (see FIG. 6). Between the shielding field electrode trenches 32, a well region 35 is arranged, which is electrically connected to the vertical power FET source, see in detail FIG. 2. In addition, an additional implant region 36 can be formed below the well region 35 to optimize the breakdown voltage.

The shielding field electrode trenches 32 have a larger lateral width than the field electrode trenches 6 of the vertical device 2. In consequence, since these trenches 6, 32 are in particular etched simultaneously, the shielding field electrode trenches 32 extend deeper into the semiconductor body 10, in particular the lower epitaxial layer 10.2. To shorten a vertical current path in the drift region 9 of the vertical device 2, a bridge implant region 11 is formed below its field electrode trenches 6, namely between the drift region 9 and the drain region 4. It is of the same conductivity type as the drift region 9, n-type in this example, but has a higher doping concentration.

Figure 3:
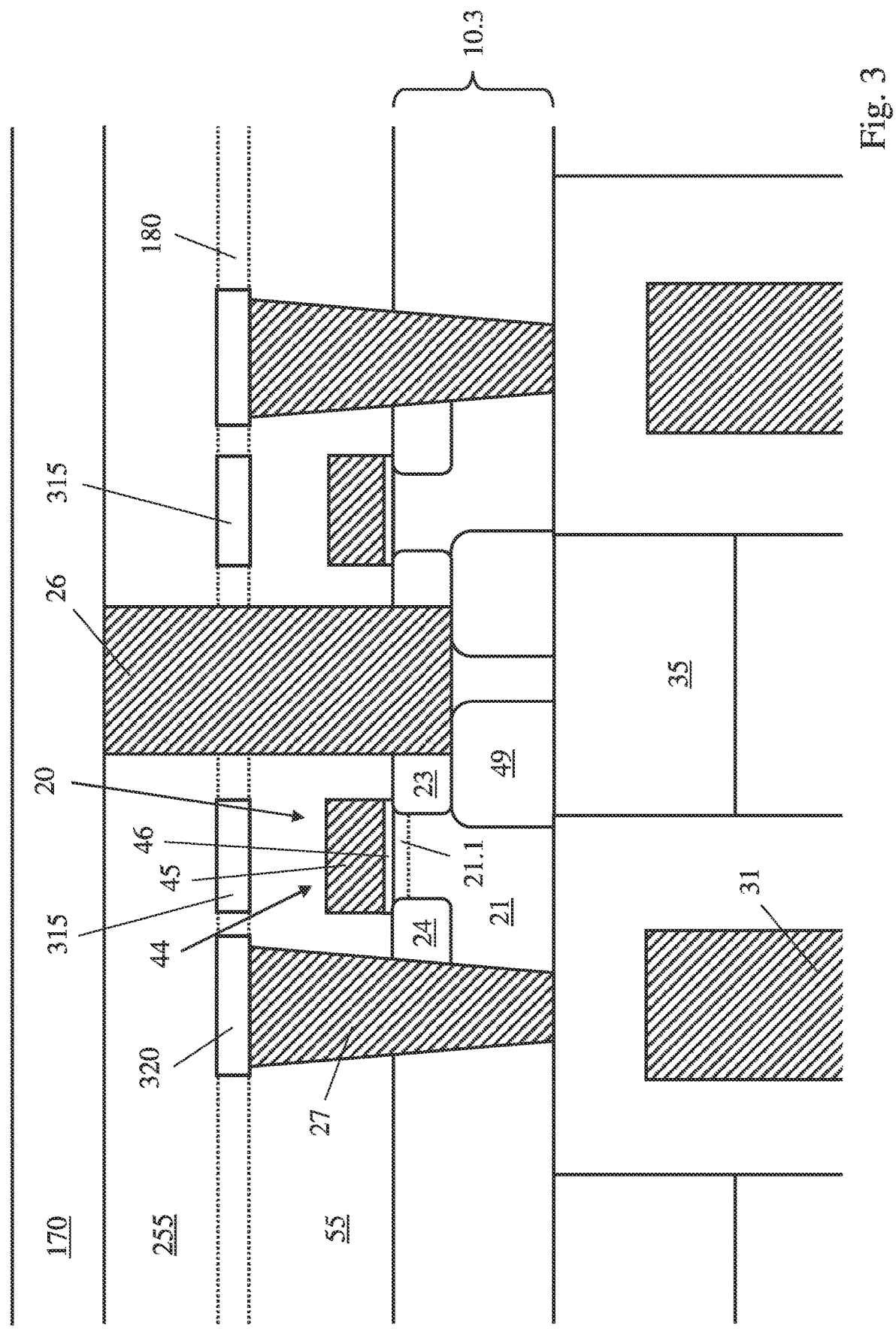
FIG. 3 illustrates the pull-device in a detailed view.

FIG. 3 illustrates the pull-down device 20 in a detailed view. Above the body region 21 with the channel region 21.1, formed between the source and drain region 23, 24, a lateral gate region 44 is arranged. It comprises a lateral gate electrode 45 and a lateral gate dielectric 46. The gate region 44 is covered by the insulating layer 55, on which a metallization layer 180 is shown partly with dashed lines. On the metallization layer 180, an additional insulating layer 255 is arranged, on which a frontside metallization 170 is formed. Above the vertical power device 2, the frontside metallization 170 forms a source plate (see below). In the area of the lateral device, it is connected to the source region 23 of the pull-down device 20 via a source contact 26. The latter intersects the insulating layers 55, 255, the source region 23 being consequently connected to the source region 3 of the vertical device 2, as illustrated in FIG. 1.

In addition, the source contact 26 contacts the well region 35 via a vertical implant region 49, the well region 35 being connected to the power device source in consequence. In the example shown, the pull-down device 20 is an n-channel device, the source and the drain region 23, 24 being n-doped, and the body region 21 being p-doped. The vertical implant region 49 and the well region 35 are also p-doped.

The drain region 24 is connected via a drain contact 27, which extends through the insulating layer 55. The drain contact 27 is contacted via a drain metallization 320 formed in the metallization layer 180 and connected to the gate electrode 5.1 of the vertical device outside the drawing plane, see FIG. 5. The gate electrode 45 of the pull-down device 20, forming its control terminal 145, is connected to the second capacitor electrode 162, namely is coupled to the drain region 4 of the vertical device 2 via the resistor $R_1$ and the capacitor C.

FIG. 4 illustrates the capacitor, namely the first and the second capacitor electrode 161, 162, The first capacitor electrode 161 is formed by the drain region 4, which extends over the whole backside of the die (common drain backside). The second capacitor electrode 162 comprises trench electrodes 165 formed in a capacitor trench 166 respectively. The capacitor trenches 166 are etched into the lower epitaxial layer 10.2, the upper epitaxial layer 10.3 is formed subsequently above. In this region of the die, the lower epitaxial layer 10.2 can for instance be doped as in the region of the power device, e. g. like the drift region. Via vertical interconnects 182 extending through the insulating layer 55, the trench electrodes 165 are connected to the metallization layer 180. There, a wiring to the gate electrode 45 of the pull-down device 20 is realized (which is different from the drain metallization 320 realised in the same metallization layer 180). In case of an overshoot event, the common drain backside is charged, which is picked up by the trench electrodes 165, such that the pull-down device 20 is switched into the conducting state and grounds the gate of the power device. Via highly doped contact regions 197, the interconnects 182 are connected to embedded regions 198 of the same conductivity type like the body region 104, p-type in the example here, and connected to the latter. Alternatively, the interconnect 182 could extend through an isolator.

FIG. 5 illustrates the wiring and connection between the devices 2, 20 in a top view. In the layer of the frontside metallization 170, two source plates 300 are formed. Laterally in between, but at a smaller vertical height, a gate runner 305 extends, which is formed in the metallization layer 180. All structures shown cross-hatched are formed in the same layer, the source plates 300 lying above and separated via the second insulating layer 255 (not shown here). The capacitor metallization 310 is formed above the capacitor trenches 166 (see FIG. 4), via fingers 315 it contacts the gate electrode or electrodes 45 of the lateral devices 20.

The small rectangles below the pull-down device 20 indicate field electrode contacts 330, which connect the shielding field electrodes to the frontside metallization 180, namely to source potential. Via the first and the second resistor $R_1$ and $R_2$ shown in FIG. 1, e. g. the required timing for the charging and discharging of the control terminal 145 of the pull-down device 20 can be adjusted. The resistance of $R_1$ can for instance be influenced by the capacitor metallization 310 and the fingers 315, and also via the vertical interconnects 182 and the resistance of the trench electrode 165 shown in FIG. 4. The second resistor $R_2$ can for instance be adjusted via vertical trenches or holes extending through the additional insulating layer 255 and connecting the capacitor metallization 310 and/or the fingers 315 to the frontside metallization 170, the trenches or holes being for instance filled with polysilicon to achieve a required resistance (which will depend on the application and the capacity and can for instance lie in a range of 10-200 Ω).

Laterally in between, respectively, the source contact 26 is shown (not cross-hatched, with horizontal stripes), connecting the source region 23 to the source plate 300. Moreover, the drain metallization 320 of the pull-down device 20 is shown, connecting the pull-down device 20 to the gate runner 305. When the pull-down device 20 is in the conducting state, it connects the gate runner 305, namely the gate of the vertical device, to the source plate 300, namely to ground potential. For the purpose of illustration, a gate pad 325 is shown additionally.

FIG. 6 illustrates a section through the field electrode contacts 330 shown in FIG. 4. They extend through the first and the second insulating layer 55, 255, connecting the shielding field electrodes 31 to the frontside metallization 180, namely to source potential. Together with the well regions 35, which are contacted inside the cell field of the pull-down device 20 (see FIG. 4 or 5), they shield the lateral device from the backside potential of the drain region 4. Via highly doped contact regions 197, the field electrode contacts 330 are connected to embedded regions 198 (p-type in the example here) and in consequence to the well regions 35.

Figure 7D:
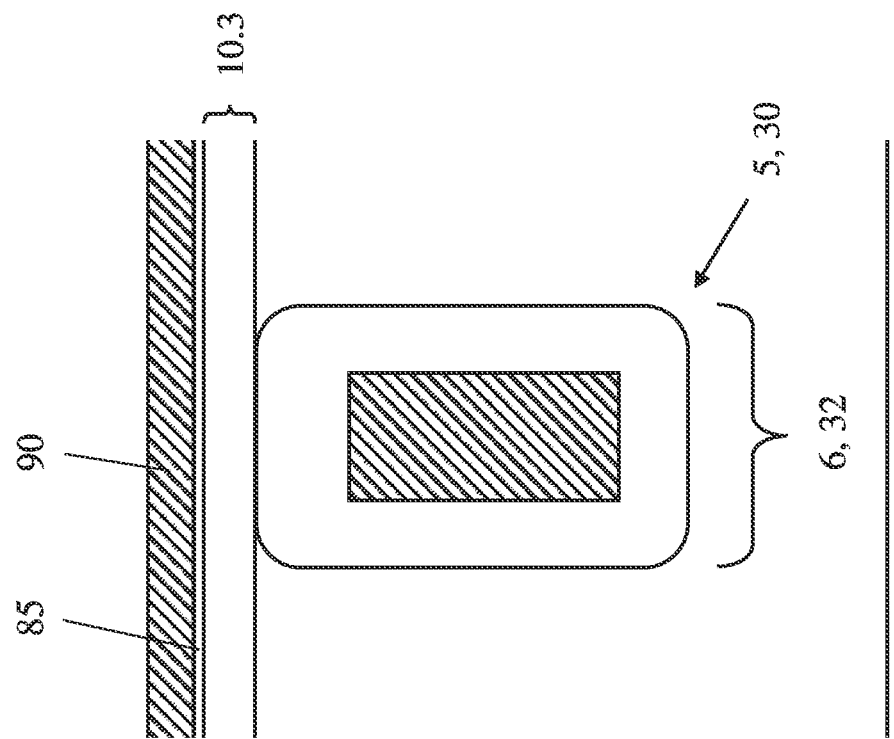
Figure 7C:
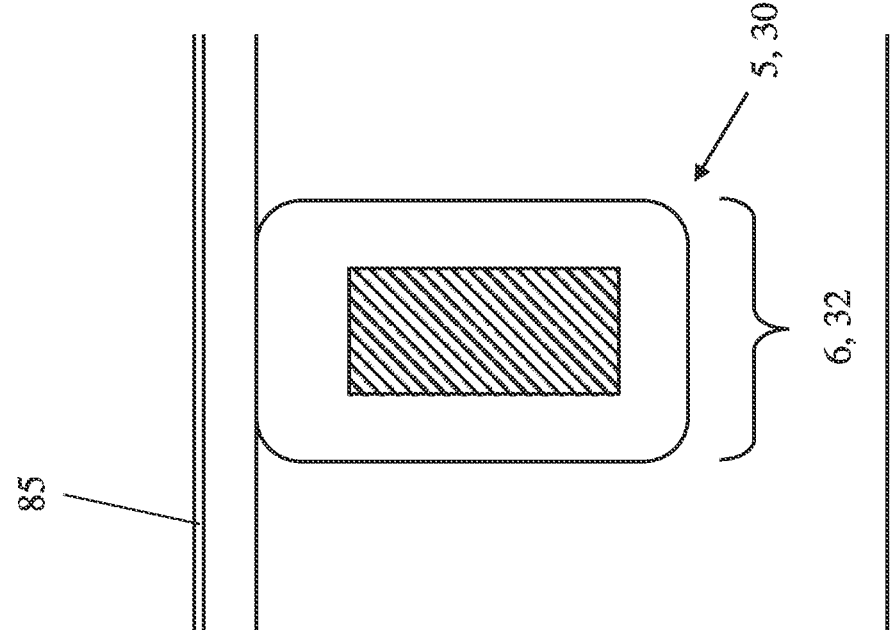

FIGS. 7a-d illustrate some manufacturing steps that can apply for both, the vertical and the lateral device. In FIG. 7a, the respective trench 6, 32 has been etched into the lower epitaxial layer 10.2, and the respective field electrode region 5, 30 has been formed. Then, the upper epitaxial layer 10.3 is deposited, covering the respective trench 6, 32, see FIG. 7b. Subsequently, a dielectric layer 85 is deposited (FIG. 7c), followed by a deposition of an electrically conductive layer 90. By structuring the latter, e.g. prior to the deposition by a mask or in a subsequent etch back step, the gate electrode or electrodes can be defined. The dielectric layer 85 defines the gate dielectric, it can be removed from other locations of the die in an etch back step after the gate electrode formation. Implantations forming the different regions in the upper epitaxial layer 10.3 can be performed in between steps 7b and c and/or after the gate electrode formation. The upper epitaxial layer 10.3 can be doped in situ or in particular after its deposition to form the regions required for the respective device.

Figure 8:
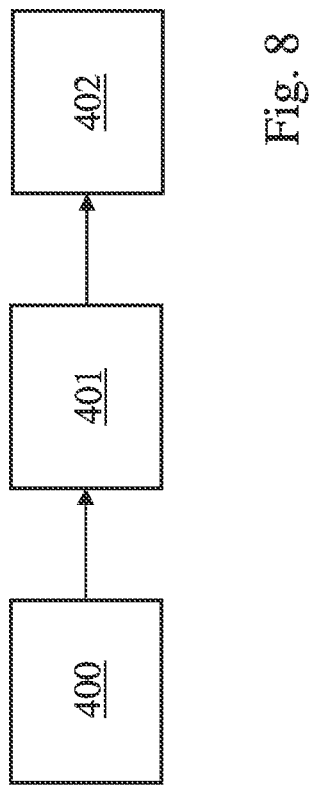
FIG. 8 summarizes some manufacturing steps in a flow diagram.

FIG. 8 shows a flow diagram and summarizes some process steps, the manufacturing comprises forming 400 the vertical power device 2 and forming 401 the pull-down transistor device 20, wherein at least some sub steps can be performed simultaneously. Moreover, the manufacturing comprises forming 402 the capacity C, wherein the first capacitor electrode 161 can in particular be formed simultaneously with the drain region 4 of the vertical device 2 and/or the second capacitor electrode 162 can be formed simultaneously with field electrodes 7 of the vertical device 2 or the shielding field electrodes 31 below the pull-down device 20.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a vertical power transistor device having a source region and a drain region at opposite sides of a semiconductor body and forming a load terminal, respectively, and a gate electrode;
   a pull-down transistor device having a control terminal and switchable between a conducting state and a blocking state via the control terminal, and a capacitor;
   a resistor connected between the capacitor and the control terminal of the pull-down transistor device,
   wherein the pull-down transistor device is connected between the gate electrode of the vertical power transistor device and a ground terminal and connects the gate electrode to the ground terminal in the conducting state,
   wherein the capacitor is connected between one of the load terminals of the vertical power transistor device and the control terminal of the pull-down transistor device and capacitively couples the one of the load terminals to the control terminal.

2. The semiconductor die of claim 1, further comprising a resistor connected between the control terminal of the pull-down transistor device and the ground terminal.

3. The semiconductor die of claim 1, wherein the vertical power transistor device is an n-channel device and the capacitor is connected to the drain region of the vertical power transistor device, and wherein the source region of the vertical power transistor device is connected to the ground terminal.

4. The semiconductor die of claim 1, wherein the capacitor is connected to the drain region of the vertical power transistor device, and wherein the drain region is arranged at a backside of the semiconductor body and forms a first capacitor electrode of the capacitor.

5. The semiconductor die of claim 1, wherein the source region of the vertical power transistor device and a source region of the pull-down transistor device are electrically connected via a frontside metallization layer of the vertical power transistor device formed on a frontside of the semiconductor body, and wherein the frontside metallization layer extends above the pull-down transistor device.

6. The semiconductor die of claim 1, wherein a drain region of the pull-down transistor device and the gate electrode of the vertical power transistor device are electrically connected in a metallization layer, in which a gate pad of the semiconductor die and/or a gate runner laterally aside the vertical power transistor device are formed.

7. The semiconductor die of claim 1, wherein the pull-down transistor device has a body region with a lateral channel region, and a source and a drain region formed at a frontside of the semiconductor body, wherein a well region is formed in the semiconductor body, the well region doped with an opposite conductivity type as the source and the drain region of the vertical power transistor device, and wherein at least a portion of the pull-down transistor device is arranged vertically above the well region.

8. The semiconductor die of claim 1, wherein the pull-down transistor device has a body region with a lateral channel region, and a source and a drain region formed at a frontside of the semiconductor body, wherein a shielding field electrode region with a shielding field electrode is formed in a shielding field electrode trench in the semiconductor body, and wherein at least a portion of the pull-down transistor device is arranged vertically above the shielding field electrode region.

9. The semiconductor die of claim 1, wherein a second capacitor electrode of the capacitor, which is connected to the control terminal of the pull-down transistor device, comprises a trench electrode formed in a capacitor trench in the semiconductor body.

10. The semiconductor die of claim 9, wherein the vertical power transistor device comprises a field electrode region formed in a field electrode trench in a drift region, and wherein the field electrode trench and the capacitor electrode trench have the same depth.

11. The semiconductor die of claim 9, wherein the second capacitor electrode comprises a plurality of trench electrodes, each formed in a respective capacitor trench in the semiconductor body, wherein a metallization layer is formed on a frontside of the semiconductor body above an insulating layer, and wherein the metallization layer is connected to the trench electrodes via vertical interconnects.

12. The semiconductor die of claim 9, wherein the semiconductor body comprises a lower semiconductor body and an upper epitaxial layer deposited onto the lower semiconductor body, wherein the capacitor trench extends from a frontside of the lower semiconductor body into the lower semiconductor body.

13. The semiconductor die of claim 1, wherein the semiconductor body comprises a lower semiconductor body and an upper epitaxial layer deposited on the lower semiconductor body, and wherein the source region and a channel region of the vertical power transistor device are formed in the upper epitaxial layer.

14. A semiconductor die, comprising:
a vertical power transistor device having a source region and a drain region at opposite sides of a semiconductor body and forming a load terminal, respectively, and a gate electrode;
a pull-down transistor device having a control terminal and switchable between a conducting state and a blocking state via the control terminal, and a capacitor,
wherein the pull-down transistor device is connected between the gate electrode of the vertical power transistor device and a ground terminal and connects the gate electrode to the ground terminal in the conducting state,
wherein the capacitor is connected between one of the load terminals of the vertical power transistor device and the control terminal of the pull-down transistor device and capacitively couples the one of the load terminals to the control terminal,
wherein the source region of the vertical power transistor device and a source region of the pull-down transistor device are electrically connected via a frontside metallization layer of the vertical power transistor device formed on a frontside of the semiconductor body,
wherein the frontside metallization layer extends above the pull-down transistor device.

15. The semiconductor die of claim 14, further comprising a resistor connected between the control terminal of the pull-down transistor device and the ground terminal, wherein the resistor is formed in a metallization layer arranged on a smaller vertical height than the frontside metallization layer.

16. A semiconductor die, comprising:
a vertical power transistor device having a source region and a drain region at opposite sides of a semiconductor body and forming a load terminal, respectively, and a gate electrode;
a pull-down transistor device having a control terminal and switchable between a conducting state and a blocking state via the control terminal, and a capacitor,
wherein the pull-down transistor device is connected between the gate electrode of the vertical power transistor device and a ground terminal and connects the gate electrode to the ground terminal in the conducting state,
wherein the capacitor is connected between one of the load terminals of the vertical power transistor device and the control terminal of the pull-down transistor device and capacitively couples the one of the load terminals to the control terminal,
wherein a drain region of the pull-down transistor device and the gate electrode of the vertical power transistor device are electrically connected in a metallization layer, in which a gate pad of the semiconductor die and/or a gate runner laterally aside the vertical power transistor device are formed.

17. A semiconductor die, comprising:
a vertical power transistor device having a source region and a drain region at opposite sides of a semiconductor body and forming a load terminal, respectively, and a gate electrode;
a pull-down transistor device having a control terminal and switchable between a conducting state and a blocking state via the control terminal, and a capacitor,
wherein the pull-down transistor device is connected between the gate electrode of the vertical power transistor device and a ground terminal and connects the gate electrode to the ground terminal in the conducting state,
wherein the capacitor is connected between one of the load terminals of the vertical power transistor device and the control terminal of the pull-down transistor device and capacitively couples the one of the load terminals to the control terminal,
wherein the pull-down transistor device has a body region with a lateral channel region, and a source and a drain region formed at a frontside of the semiconductor body,
wherein a well region is formed in the semiconductor body, the well region doped with an opposite conductivity type as the source and the drain region of the vertical power transistor device,
wherein at least a portion of the pull-down transistor device is arranged vertically above the well region.

18. The semiconductor die of claim 17, further comprising an additional implant region formed below the well region and configured to optimize breakdown voltage.

19. A semiconductor die, comprising:
a vertical power transistor device having a source region and a drain region at opposite sides of a semiconductor body and forming a load terminal, respectively, and a gate electrode;
a pull-down transistor device having a control terminal and switchable between a conducting state and a blocking state via the control terminal, and a capacitor,
wherein the pull-down transistor device is connected between the gate electrode of the vertical power transistor device and a ground terminal and connects the gate electrode to the ground terminal in the conducting state,
wherein the capacitor is connected between one of the load terminals of the vertical power transistor device and the control terminal of the pull-down transistor device and capacitively couples the one of the load terminals to the control terminal,
wherein the pull-down transistor device has a body region with a lateral channel region, and a source and a drain region formed at a frontside of the semiconductor body,
wherein a shielding field electrode region with a shielding field electrode is formed in a shielding field electrode trench in the semiconductor body,
wherein at least a portion of the pull-down transistor device is arranged vertically above the shielding field electrode region.

20. The semiconductor die of claim 19, wherein the semiconductor body comprises a lower semiconductor body and an upper epitaxial layer deposited onto the lower semiconductor body, and wherein the shielding field electrode trench extends from a frontside of the lower semiconductor body into the lower semiconductor body.

21. A semiconductor die, comprising:
a vertical power transistor device having a source region and a drain region at opposite sides of a semiconductor body and forming a load terminal, respectively, and a gate electrode; and
a pull-down transistor device having a control terminal and switchable between a conducting state and a blocking state via the control terminal, and a capacitor,
wherein the pull-down transistor device is connected between the gate electrode of the vertical power transistor device and a ground terminal and connects the gate electrode to the ground terminal in the conducting state,
wherein the capacitor is connected between one of the load terminals of the vertical power transistor device and the control terminal of the pull-down transistor device and capacitively couples the one of the load terminals to the control terminal,
wherein the second capacitor electrode comprises a plurality of trench electrodes, each formed in a respective capacitor trench in the semiconductor body,
wherein a metallization layer is formed on a frontside of the semiconductor body above an insulating layer,
wherein the metallization layer is connected to the trench electrodes via vertical interconnects.

* * * * *